(12) United States Patent
Martens et al.

(10) Patent No.: US 12,368,451 B2
(45) Date of Patent: Jul. 22, 2025

(54) SLOPE ANALOG-TO-DIGITAL CONVERTER, A SYSTEM AND A METHOD FOR CONVERTING AN ANALOG INPUT SIGNAL TO A DIGITAL REPRESENTATION

(71) Applicant: IMEC VZW, Leuven (BE)

(72) Inventors: Ewout Martens, Heverlee (BE); Jan Craninckx, Boutersem (BE)

(73) Assignee: IMEC VZW, Leuven (BE)

( * ) Notice: Subject to any disclaimer, the term of this patent is extended or adjusted under 35 U.S.C. 154(b) by 227 days.

(21) Appl. No.: 18/135,918

(22) Filed: Apr. 18, 2023

(65) Prior Publication Data

US 2023/0344441 A1   Oct. 26, 2023

(30) Foreign Application Priority Data

Apr. 20, 2022   (EP) ..................... 22169019

(51) Int. Cl.
  *H03M 1/12* (2006.01)
  *H03M 1/42* (2006.01)
(52) U.S. Cl.
  CPC ........... *H03M 1/42* (2013.01); *H03M 1/1245* (2013.01)
(58) Field of Classification Search
  CPC .............................. H03M 1/42; H03M 1/1245
  USPC .................................. 341/155, 118, 120, 122
  See application file for complete search history.

(56) References Cited

U.S. PATENT DOCUMENTS 3,781,872 A * 12/1973 Frye ........................ H03M 1/58
  341/170

11,108,402 B1 * 8/2021 Strijker ..................... H03M 1/82
2012/0050082 A1 * 3/2012 Danesh ............... H03M 1/1215
  341/122

FOREIGN PATENT DOCUMENTS

CN   110944125 A * 3/2020   ......... H04N 5/35527
EP   4047821 A1   8/2022

OTHER PUBLICATIONS

Ham et al: "CMOS Image Sensor with Analog Gamma Correction using Nonlinear Single-Slope ADC", IEEE International Symposium on Circuits and Systems, pp. 3578-3581, 2006.
Xie et al: "A Nonlinear ADC for CMOS Image Sensor", IEEE International Conference on Solid-State and Integrated Circuit Technology, pp. 1-3, 2018.

(Continued)

*Primary Examiner* — Peguy Jean Pierre
(74) *Attorney, Agent, or Firm* — MOSER TABOADA

(57) ABSTRACT

A slope analog-to-digital converter, ADC, for converting an analog input signal to a digital representation, said slope ADC comprising: a comparator configured to compare two input signals, wherein a sampled value of the analog input signal and a slope signal are used in forming the two input signals; a memory element, which is configured to receive a trigger signal based on the comparator identifying a change in which of the two input signals is higher, and a counter signal, wherein a value of the counter signal when the trigger signal is received provides the digital representation of the sampled value of the analog input signal; wherein the slope signal and the counter signal have a nonlinear relationship, wherein the nonlinear relationship is adapted to improve linearity of a transfer function of the slope ADC for converting the analog input signal to the digital representation.

14 Claims, 8 Drawing Sheets

(56) References Cited

OTHER PUBLICATIONS

Dai et al: "A segmented SAR/SS ADC with digital error correction and programmable resolution for col. parallel sensor arrays", IEEE International Symposium on Circuits and Systems, pp. 1-5, 2020.
Osaki et al: "A Low-Power Single-Slope Analog-to-Digital Converter with Digital PVT Calibration", IEEE International Conference on Electronics, Circuits and Systems, pp. 613-616, 2012.
Pastorelli et al: "ADC Techniques for Optimized Conversion Time in CMOS Image Sensors", Proceedings of IS&T International Symposium on Electronic Imaging: Image Sensors and Imaging Systems, 2016.
Kim et al: "An Enhanced Dynamic-Range CMOS Image Sensor Using a Digital Logarithmic Single-Slope ADC", IEEE Transactions on Circuits and Systems—II: Express Briefs, vol. 59, No. 10, pp. 653-657, 2012.
Liu et al: "A 1.5V 33Mpixel 3D-Stacked CMOS Image Sensor with Negative Substrate Bias", IEEE Solid-State Circuits Conference, pp. 124-126, 2016.
Kwon et al: "A Novel Double Slope Analog-to-Digital Converter for a High-Quality 640×480 CMOS Imaging System", 6th International Conference on VLSI and CAD, pp. 335-338, 1999.
Pastorelli et al: "Piece-Wise-Linear Ramp ADC for CMOS Image Sensor and Calibration Techniques", Proceedings International Image Sensor Workshop, pp. 204-207, 2015.
Im et al: "Design of a Pseudo-Wide Dynamic Range CMOS Image Sensor by Using the Bidirectional Gamma Curvature Technique", IEEE Transactions on Circuits and Systems—II: Express Briefs, vol. 68, No. 5, pp. 1596-1599, 2021.
Hwang et al: "A Wide Dynamic Range CMOS Image Sensor Based on a New Gamma Correction Technique", IEEE International SoC Design Conference, pp. 131-134, 2012.
Wang et al: "Pixel Optimizations and Digital Calibration Methods of a CMOS Image Sensor Targeting High Linearity", IEEE Transactions on Circuits and Systems—I: Regular Papers, vol. 66, No1 3, pp. 930-940, 2019.
Extended European Search Report for Application No. 22169019.1-1205 dated Oct. 14, 2022.

\* cited by examiner

SLOPE ANALOG-TO-DIGITAL CONVERTER, A SYSTEM AND A METHOD FOR CONVERTING AN ANALOG INPUT SIGNAL TO A DIGITAL REPRESENTATION

CROSS-REFERENCE TO RELATED APPLICATIONS

The present application claims the benefit of and priority to EP Patent Application Serial No. 22169019.1, filed Apr. 20, 2022, the entire contents of which is incorporated herein by reference.

TECHNICAL FIELD

The present inventive concept relates to a slope analog-to-digital converter and a method for converting an analog input signal to a digital representation. The present inventive concept also relates to a system comprising a plurality of slope analog-to-digital converters.

BACKGROUND

A slope analog-to-digital converter (ADC) comprises a comparator, which is configured to compare an analog input signal to a slope signal. The slope signal may assume signal levels corresponding to all possible digital values. A digital representation of the analog input signal may be determined based on toggling of an output from a comparator. The output toggles when there is a shift in which of the analog input signal and the slope signal is larger, and this may be used for determining the digital representation of the analog input signal.

However, the analog-to-digital conversion may not correctly convert the analog input signal to the digital representation over an entire range of possible values of the analog input signal. Thus, it would be desired to improve analog-to-digital conversion of the analog input signal over the range of possible values.

SUMMARY

An objective of the present inventive concept is to provide a slope ADC that provides accurate conversion of the analog input signal over an entire range of possible values of the analog input signal.

This and other objectives of the present inventive concept are at least partly met by the invention as defined in the independent claims. Preferred embodiments are set out in the dependent claims.

According to a first aspect, there is provided a slope analog-to-digital converter, ADC, for converting an analog input signal to a digital representation, said slope ADC comprising: a comparator configured to compare two input signals, wherein a sampled value of the analog input signal and a slope signal are used in forming the two input signals; a memory element, which is configured to receive a trigger signal based on the comparator identifying a change in which of the two input signals is higher, and a counter signal, wherein a value of the counter signal when the trigger signal is received provides the digital representation of the sampled value of the analog input signal; wherein the slope signal and the counter signal have a nonlinear relationship, wherein the nonlinear relationship is adapted to improve linearity of a transfer function of the slope ADC for converting the analog input signal to the digital representation.

The analog input signal may experience nonlinearities in processing of the analog input signal before the analog input signal is converted to the digital representation. Such nonlinearities may be caused, for example, by an input buffer or by sampling of the analog input signal. In particular, if a plurality of slope ADCs are used, the analog input signal may be transferred through a sampling network before being sampled onto a sampling capacitor, and the sampling network may introduce nonlinear effects on the analog input signal. The nonlinear effects may for instance be caused by clock feedthrough or by nonlinear gain of input buffers.

The analog input signal experiencing nonlinearities implies that the analog input signal may be differently affected by processing of the analog input signal depending on a value of the analog input signal. In particular, the analog input signal may be differently affected by processing of the analog input signal in going from an analog input signal to a sampled value of the analog input signal.

Thanks to the slope ADC according to the first aspect, a nonlinear relationship between a slope signal and a counter signal is used. This implies that the slope ADC may compensate for any nonlinearities in processing of the analog input signal. This implies that the slope ADC may provide an accurate conversion of values of the analog input signal to the digital representation over the entire range of possible values of the analog input signal. In particular, the slope ADC may be able to provide accurate conversion of small and large values of the analog input signal within the range of possible values.

The nonlinear relationship between the slope signal and the counter signal may be used for compensating for any nonlinearities in processing of the analog input signal. Thus, instead of trying to avoid nonlinear effects of components in the slope ADC, the nonlinear relationship between the slope signal and the counter signal could be used for handling such effects. Also, since the slope ADC may provide a correct digital representation of the analog input signal, there may be no need of digital post-processing in order to handle errors in the analog-to-digital conversion.

A linear transfer function of the slope ADC implies that values of the digital representation can be expressed by a linear function of the values of the analog input signal, i.e., a function whose graph is a straight line. The nonlinear relationship between the slope signal and the counter signal is used such that transfer function of the slope ADC becomes closer to a straight line compared to if a linear relationship between the slope signal and the counter signal would be used. Hence, the nonlinear relationship being adapted to improve linearity of a transfer function should be construed as the transfer function being closer to being linear compared to a transfer function of the slope ADC if a linear relationship between the slope signal and the counter signal would be used.

Linearity of the transfer function may be expressed in terms of total harmonic distortion components in the digital representation of the analog input signal, expressed as decibels relative to a carrier frequency (dBc) of the analog input signal. The linearity may be measured based on a size of a harmonic distortion component or based on a total harmonic distortion (THD) which may be expressed as a percentage of a strength of the analog input signal or based on a signal-to-distortion ratio (SDR), which is an inverse of THD and may be expressed as dB.

As an alternative, linearity of the transfer function may be expressed in terms of a differential nonlinearity. The differential nonlinearity is a measure of a worst-case deviation between values of the analog input signal corresponding to a step of 1 least significant bit (LSB) in the digital representation. The differential nonlinearity may be measured as a deviation expressed in LSBs.

As another alternative, linearity of the transfer function may be expressed in terms of a maximum integral nonlinearity. The integral nonlinearity for a value of the digital representation is a measure of a maximum deviation between an ideal transfer curve (straight line) representing conversion of the analog input signal to digital representation and an actual transfer curve.

The relationship between the slope signal and the counter signal may be expressed as a function mapping one signal onto the other signal, expressing the counter signal as a function of the slope signal or vice versa. It should be realized that both the slope signal and the counter signal vary with time and that the function maps one signal at a particular point in time to the other signal at the same particular point in time. Since the slope signal and the counter signal have a nonlinear relationship, the slope signal and the counter signal will not vary with time in the same manner.

The slope signal provides an input to the comparator such that one of the two input signals compared by the comparator varies with time. The output of the comparator may toggle when there is a change in which of the two input signals is larger and timing of the shift corresponds to a value of the analog input signal.

The memory element receives a trigger signal when the comparator identifies the change in which of the two input signals is larger. The memory element also receives a counter signal. The value of the counter signal when the trigger signal is received provides the digital representation of the sampled value of the analog input signal.

Thus, if the analog input signal would not experience any nonlinearities, the counter signal should assume values in a pace corresponding to changing of values of the slope signal.

The slope signal may be an analog signal, which is provided to a comparator which is configured to compare two analog signals. The counter signal may be a digital signal, i.e., the counter signal may change values in fixed time steps and maintain a constant value between the steps. The counter signal may be provided as a series of bits and the counter signal may increase the least significant bit in every step.

It should be realized that the comparator being configured to compare two input signals may be configured to compare the sampled value of the analog input signal to the slope signal. However, the comparator does not necessarily directly compare the sampled value of the analog input signal to the slope signal. Rather, in some embodiments, the comparator may be configured to receive a combination of the sampled value and the slope signal, wherein the combination of the sampled value and the slope signal is compared to a fixed reference.

During use of the slope ADC, the comparator may be configured to continuously compare the two input signals and to output a high or low signal depending on which of the two input signals is higher.

The memory element may be configured to read in the value of the counter signal when the trigger signal is received. Thus, the memory element may then store the value of the counter signal as the digital representation of the sampled value of the analog input signal. The value may then be output or read from the memory element for providing the digital representation of the sampled value from the slope ADC.

The memory element may for instance be a flip flop or latch circuit, which provides a simple implementation of the memory element.

According to an embodiment, the slope ADC further comprises an input unit comprising a sampling capacitor, wherein the input unit is configured to receive the analog input signal and hold the sampled value of the analog input signal on the sampling capacitor, wherein the adaptation of the nonlinear relationship of the slope signal and the counter signal includes a compensation for a nonlinear relation between the analog input signal and the sampled value held by the sampling capacitor.

When a single slope ADC is used in isolation, nonlinear effects on the analog input signal may be provided only through the sampling of the analog input signal onto the sampling capacitor. The slope signal and the counter signal may have a nonlinear relationship that is adapted to improve linearity of the transfer function of the slope ADC by compensating for the nonlinear relation between the analog input signal and the sampled value.

However, it should be realized that the analog input signal may experience nonlinearities caused by other types of processing of the analog input signal. In particular, if the analog input signal is to be provided to a plurality of slope ADCs, such as in a time-interleaved slope ADC, the analog input signal may experience nonlinearities in an input buffer or in processing of the analog input signal for feeding the analog input signal to the plurality of slope ADCs through a sampling network.

It should be realized that the nonlinear relationship of the slope signal and the counter signal may be configured to compensate for any nonlinear relation between the analog input signal and the output digital representation. This may include the nonlinear relation between the analog input signal and the sampled value held by the sampling capacitor but may also include other nonlinear relations.

According to an embodiment, the slope signal is configured to vary between a minimum value and a maximum value, wherein the slope signal is monotonically increasing or monotonically decreasing between the minimum value and the maximum value.

The slope signal may be configured to assume values that correspond to an entire range of possible values of the analog input signal. The slope signal may thus vary between a minimum value and a maximum value. The slope signal may be configured to periodically provide a monotonical increase from a minimum value to a maximum value, the slope signal being reset to the minimum value when the maximum value is reached. Alternatively, the slope signal may be configured to periodically provide a monotonical decrease from a maximum value to a minimum value, the slope signal being reset to the maximum value when the minimum value is reached.

The slope signal may be increased or decreased in steps and may have a constant value between the steps. In other embodiments, the slope signal may be strictly increasing or strictly decreasing.

Thanks to the slope signal being a monotonic signal, there will be one shift of which of the two input signals to the comparator is higher during the monotonic increase or monotonic decrease. This implies that a single trigger signal may be provided to the memory element during the monotonic increase or monotonic decrease such that reading of a value of the counter signal into the memory element may be well-controlled.

It should be realized that a conversion period for converting one sampled value of the analog input signal to a digital representation need not necessarily correspond to the monotonical increase or monotonical decrease of the slope signal. Rather, at start of the conversion period, the slope signal may be in-between the minimum value and the maximum value during its monotonical increase or monotonical decrease. Thus, at the beginning of the conversion period, the sampled value may be compared to a first sub-range of values of the slope signal. Then, the slope signal may be reset, and the sampled value may be compared to a second sub-range of values of the slope signal. However, during the full conversion period, the slope signal will assume all values between the minimum value and the maximum value once. The conversion period may be (slightly) longer than a time period required for the slope signal to assume all values in order to ensure that the sampled value may be properly converted to a digital representation and that all possible values of the slope signal are truly assumed during the conversion period.

According to an embodiment, the slope signal is nonlinear in relation to time during monotonical increase or monotonical decrease.

As mentioned above, the slope signal and the counter signal vary with time and the relationship may be expressed by a function mapping one signal at a particular point in time to the other signal at the same particular point in time. Since the slope signal and the counter signal have a nonlinear relationship, the slope signal and the counter signal will not vary with time in the same manner and at least one of the slope signal or the counter signal has a nonlinear relation to time.

At least the slope signal may be nonlinear in relation to time during the monotonical increase or the monotonical decrease. This may be relatively easily achieved by controlling the generation of the slope signal.

According to an embodiment, the counter signal is nonlinear in relation to time.

Thus, the counter signal may be nonlinear in relation to time in addition to, or instead of, the slope signal being nonlinear in relation to time in order to provide the nonlinear relationship between the slope signal and the counter signal.

The counter signal may be nonlinear in relation to time based on varying of a clock frequency such that a period between changes of a bit of the counter signal (controlled by the clock frequency) may be varied. According to an alternative, the increasing of the counter signal by a bit may be based on different periods of the clock signal, such as the counter signal being increased after 1 period, 2 periods, etc. of the clock signal.

According to an embodiment, said two input signals are the sampled value of the analog input signal and the slope signal such that the comparator is configured to compare the sampled value of the analog input signal and the slope signal.

This implies that the comparator may receive the sampled value of the analog input signal on a first input terminal of the comparator and the slope signal on a second input terminal of the comparator. Thus, the comparator may directly compare the sampled value of the analog input signal to the slope signal. This may provide a simple arrangement of the signals to the comparator.

However, it should be realized that the sampled value of the analog input signal need not necessarily be directly compared to the slope signal. According to an alternative, the slope signal may be combined with the analog input signal such that the combined signal varies with time. The comparator may be configured to compare the combined signal with a fixed reference signal, such that the comparator may still identify a change in which of the two input signals is higher and the change may be related to the sampled value of the analog input signal.

According to an embodiment, the nonlinear relationship between the slope signal and the counter signal is based on a calibration of a nonlinear transfer function of the slope ADC for converting the analog input signal to the digital representation.

The slope ADC may exhibit a nonlinear transfer function if a linear relationship between the slope signal and the counter signal is used. The nonlinear transfer function may comprise static nonlinearities, that is nonlinearities that are not affected by a frequency of the analog input signal and may further comprise dynamic nonlinearities that are affected by the frequency of the analog input signal.

The calibration may be used for determining static nonlinearities, which may be compensated for by controlling the nonlinear relationship between the slope signal and the counter signal.

The calibration may involve providing an analog input signal with known properties and analyzing the digital representation output by the slope ADC. Thus, the calibration may be used for determining the nonlinear transfer function of the slope ADC and the nonlinear relationship between the slope signal and the counter signal may then be set in order to compensate for the nonlinear transfer function.

The calibration may use a known test signal, which is applied to the slope ADC and compared to the digital output. This may involve determining differential nonlinearities and/or integral nonlinearities over the range of possible values of the analog input signal.

However, the calibration may alternatively be based on statistics, wherein statistics of the digital output from the slope ADC is compared to known statistics of the analog input signal, whereby nonlinearities of the slope ADC may be determined.

The calibration allows determination of nonlinearities of the slope ADC so that compensation may be performed, regardless of a cause of the nonlinearities. Thus, any nonlinearity in the slope ADC may be compensated for.

According to an embodiment, the slope signal is based on a linear monotonically increasing or monotonically decreasing signal in combination with a nonlinear signal based on said calibration.

This implies that the calibration may be used for determining a compensation function. The slope signal may then be formed as a combination of an ideal linear slope signal that is combined with a nonlinear component based on the calibration.

According to a second aspect, there is provided a system for analog-to-digital conversion of analog input signals, wherein the system comprises a plurality of slope ADCs according to the first aspect.

Effects and features of this second aspect are largely analogous to those described above in connection with the first aspect. Embodiments mentioned in relation to the second aspect are largely compatible with the first aspect.

The system may be configured to provide a time-interleaved ADC. The time-interleaved ADC uses the plurality of slope ADCs, where the slope ADCs are used in combination for increasing an overall sampling rate compared to a sampling rate of individual slope ADCs in the plurality of slope ADCs.

The slope ADCs may be configured to receive the analog input signal successively in time, which implies that the analog input signal is sequentially provided to different slope ADCs among the plurality of slope ADCs. Thus, during the conversion period of a first slope ADC for determining a first value of the digital representation of the analog input signal, the analog input signal may be provided to a second slope ADC for obtaining a new sampled value of the analog input signal such that a second value of the digital representation of the analog input signal may be determined. This allows the plurality of slope ADCs to be jointly used for increasing the sampling rate of the time-interleaved ADC.

The system may alternatively be configured to provide a plurality of slope ADCs, wherein each slope ADC is dedicated to analog-to-digital conversion of a respective analog input signal such that different analog input signals are received by the different slope ADCs. The plurality of slope ADCs may thus allow converting a plurality of analog input signals in parallel to digital representations.

According to an embodiment, the system comprises a common slope signal generator and a common counter signal generator, such that the plurality of slope ADCs receive the same slope signal and the same counter signal.

This implies that the system may comprise a single slope signal generator which is common to the plurality of slope ADCs and a single counter signal generator which is common to the plurality of slope ADCs. Thanks to using the common slope signal generator and the common counter signal generator, the slope signal and the counter signal may be re-used by a large number of slope ADCs. This implies that each channel (slope ADC) within the system requires a small area, such that the system may be very compact, and small power, such that the system may be power efficient.

In particular, the time-interleaved ADC may use the common slope signal generator and the common counter signal generator. However, a system of a plurality of slope ADCs that each perform analog-to-digital conversion of a respective analog input signal may also use the common slope signal generator and the common counter signal generator as long as the nonlinearities of the slope ADCs are similar.

The system may be calibrated such that the slope signal and the counter signal are adapted to compensate static nonlinearities of the plurality of slope ADCs. If the static nonlinearities are (slightly) different among different slope ADCs, the system may be configured to compensate static nonlinearities taking the differences into account.

According to an embodiment, the nonlinear relationship between the slope signal and the counter signal is adapted to improve an average error of transfer functions of the plurality of slope ADCs.

Thus, the nonlinear relationship between the slope signal and the counter signal may compensate for an average error caused by the different static nonlinearities of the slope ADCs.

Thus, the digital output of each of the slope ADCs based on an ideal linear relationship between the slope signal and the counter signal may be used for defining an error of the transfer functions of the plurality of slope ADCs. For each point (different values of the analog input signal) of the transfer function, an error between the digital output, using the linear relationship, and the analog input may be determined. The nonlinear relationship between the slope signal and the counter signal may be fitted to the errors of all of the slope ADCs so as to allow compensation of an average error.

According to an embodiment, the system comprises a sampling network for providing sampling of a single analog input signal to the plurality of slope ADCs, wherein the nonlinear relationship of the slope signal and the counter signal is configured to compensate for nonlinearity of the sampling network.

The sampling network may be useful in the time-interleaved ADC, where the same analog input signal is to be sampled by a plurality of slope ADCs.

The sampling network may typically comprise a plurality of buffers or amplifiers. Thanks to the system being able to compensate for nonlinear effects on processing of the slope ADC, the sampling network need not be configured to avoid introducing any nonlinear effects. This may allow saving power in the sampling network, since there is no need to ensure that the buffers do not introduce nonlinear effects, such as through nonlinear gain, on the analog input signal.

According to an embodiment, the system is configured to receive a single analog input signal and the plurality of slope ADCs are configured to sample the single analog input signals successively in time for forming a time-interleaved analog-to-digital converter.

The time-interleaved ADC may jointly use the plurality of slope ADCs such that the time-interleaved ADC may provide a high sampling rate of the single analog input signal even though each of the slope ADCs need not have such a high sampling rate.

According to a third aspect, there is provided a method for converting an analog input signal to a digital representation, said method comprising: comparing by a comparator two input signals, wherein a sampled value of the analog input signal and a slope signal are used in forming the two input signals, wherein a trigger signal is output by the comparator upon identifying a change in which of the two input signals is higher; receiving by a memory element a counter signal and the trigger signal, and determining by the memory element a value of the counter signal when the trigger signal is received as the digital representation of the sampled value of the analog input signal, wherein the slope signal and the counter signal have a nonlinear relationship, wherein the nonlinear relationship is adapted to improve linearity of a transfer function for converting the analog input signal to the digital representation.

Effects and features of this third aspect are largely analogous to those described above in connection with the first, and second aspects. Embodiments mentioned in relation to the third aspect are largely compatible with the first, and second aspects.

Thanks to the method, the nonlinear relationship between the slope signal and the counter signal may be used for compensating for any nonlinearities in processing of the analog input signal. This implies that the method may provide an accurate conversion of values of the analog input signal to the digital representation over the entire range of possible values of the analog input signal.

BRIEF DESCRIPTION OF THE DRAWINGS

The above, as well as additional objects, features, and advantages of the present inventive concept, will be better understood through the following illustrative and non-limiting detailed description, with reference to the appended drawings. In the drawings like reference numerals will be used for like elements unless stated otherwise.

DETAILED DESCRIPTION

Figure 1:
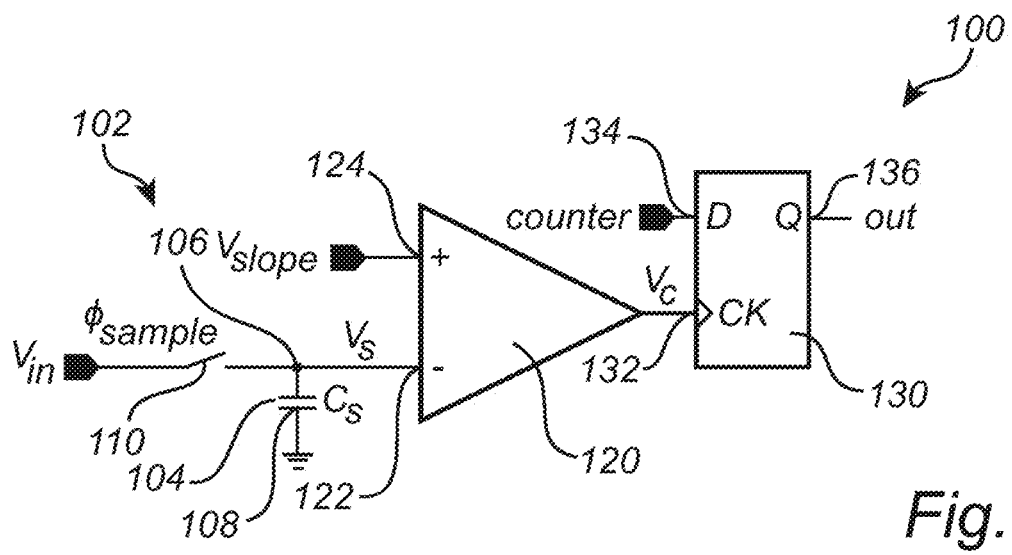
FIG. 1 is a schematic view of a slope analog-to-digital converter (ADC) according to an embodiment.

Referring now to FIG. 1, a slope analog-to-digital converter (ADC) 100 according to an embodiment will be described.

The slope ADC 100 may comprise an input unit 102 which is configured to receive an analog input signal. The input unit 102 may comprise a sampling capacitor 104, which is configured to receive the analog input signal. The analog input signal may be a voltage signal, such that the potential of a terminal of the sampling capacitor 104 may track the analog input signal when the sampling capacitor 104 is connected to receive the analog input signal and may hold (store) a value of the analog input signal when the sampling capacitor 104 is disconnected from the analog input signal. The input unit 102 may thus form a track and hold unit, but it should be realized that the input unit 102 may alternatively form a sample and hold unit.

The slope ADC 100 may receive a single-ended analog input signal $V_{in}$. In such case, the sampling capacitor 104 may be configured to receive the analog input signal on a first terminal 106 of the sampling capacitor 104, while the second terminal 108 of the sampling capacitor 104 may be connected to a fixed reference voltage, such as ground.

However, according to an alternative, the analog input signal may be a differential analog input signal comprising a first analog input signal and a second analog input signal. The differential analog input signal may be connected to the sampling capacitor 104 such that the sampling capacitor 104 receives the first analog input signal on the first terminal 106 of the sampling capacitor 104 and receives the second analog input signal on the second terminal 108 of the sampling capacitor 104. This implies that the sampling capacitor 104 is configured to track and hold the differential input signal across the sampling capacitor 104 between the first terminal 106 and the second terminal 108.

The input unit 104 may comprise a sampling switch 110, which may be configured to selectively connect the analog input signal to the first terminal 106 of the sampling capacitor 104. The sampling switch 110 may thus be active to connect the analog input signal to the sampling capacitor 106 and allow sampling of the analog input signal to obtain a sampled value $V_s$ of the analog input signal on the sampling capacitor 106. The sampling switch 110 may then be inactive disconnecting the analog input signal from the sampling capacitor 104.

The slope ADC 100 further comprises a comparator 120. The comparator 120 is configured to compare two input signals involving the sampled value of the analog input signal and a slope signal $V_{slope}$. The slope signal may have a monotonically increasing or monotonically decreasing value between a minimum value and a maximum value of the slope signal. The comparator 120 in the slope ADC 100 shown in FIG. 1 is configured to directly compare the sampled value and the slope signal, but it should be realized that a comparison of signal values involving the sampled value and the slope signal may be set up in different ways. For instance, the sampled value of the analog input signal may be combined with the slope signal forming a combined signal. The comparator 120 may be configured to compare the combined signal with a fixed reference signal.

Input to the comparator 120 may comprise a first terminal 122 and a second terminal 124. The comparator 120 may be configured to provide an output which may toggle between two values depending on whether a signal level received at the first terminal 122 or the second terminal 124 is larger. When the sampled value of the analog input signal is directly compared to the slope signal, a toggling of the output by the comparator 120 thus implies that a value of the slope signal crosses the sampled value of the analog input signal.

The slope ADC 100 further comprises a memory element 130. The memory element 130 may for instance be a flip flop or latch circuit. The memory element 130 is configured to receive a counter signal counter that may be synchronized with the slope signal. It should be realized that FIG. 1 for brevity and simplicity only shows one flip flop, but as would be understood by a person skilled in the art, if the counter signal has X bits, the memory element 130 comprises X flip flops.

The memory element 130 may further be configured to receive the output from the comparator 120. A toggling of the output by the comparator 120 may trigger that a counter value from the counter signal is read into the memory element 130 (e.g., the flip flop or latch circuit).

The memory element 130 may comprise an input 132 for receiving a trigger signal. The input 132 of the memory element 130 may receive a signal which may assume to different levels, representing a 0 or 1. The memory element 130 may be directly connected to the output by the comparator 120 such that the output by the comparator 120 is received at the input 132 of the memory element 130. Alternatively, the output by the comparator 120 may be further processed before reaching the memory element 130. For instance, the slope ADC 100 may comprise an XOR gate which conditionally inverts an output by the comparator 120 so that the trigger signal to the memory element 130 is always received based on a change in the output of the comparator at a rising edge (or a falling edge) of the output of the comparator.

The memory element 130 may further comprise a data input 134 which is configured to receive the counter signal. The memory element 130 may be configured to hold a constant data value as long as the signal received on the input 132 does not change. When the signal received on the input 132 changes, the memory element 130 reads a value of the counter signal so as to change the data value held by the memory element 130. The memory element 132 may further comprise an output 136, which outputs the data value held by the memory element 130.

The memory element 130 may be implemented as a latch circuit such that the memory element 130 may be configured as a compact and power-efficient element. However, it should be realized that the memory element 130 may be implemented in other ways, such as using any kind of static random access memory.

The memory element 130 may be configured to store the value of the counter signal at the time the trigger signal is received by the memory element 130. The value of the counter signal provides a digital representation of the sampled value of the analog input signal. The output from the memory element 130 may thus provide the digital representation of the sampled value of the analog input signal as an output from the slope ADC 100.

The relationship between the slope signal and the counter signal may be expressed as a function mapping one signal onto the other signal, expressing the counter signal as a function of the slope signal or vice versa. It should be realized that both the slope signal and the counter signal vary with time and that the function maps one signal at a particular point in time to the other signal at the same particular point in time.

The output of the comparator 120 may toggle when the slope signal assumes a value that corresponds to the sampled value of the analog input signal. In response, the trigger signal is received by the memory element 130 controlling timing of reading of the value of the counter signal into the memory element 130.

The slope ADC 100 may have a transfer function, which defines the digital representation output by the slope ADC 100 as a function of the analog input signal input to the slope ADC 100. A linear transfer function of the slope ADC 100 implies that values of the digital representation can be expressed by a linear function of the values of the analog input signal, i.e., a function whose graph is a straight line. However, if processing of the analog input signal in the slope ADC exhibits nonlinearities, i.e., the analog input signal is not processed in the same manner if the value of the analog input signal changes, the digital representation output by the slope ADC 100 is affected.

According to the inventive concept, a nonlinear relationship between the slope signal and the counter signal is used. The nonlinear relationship between the slope signal and the counter signal is set so as to compensate for any nonlinearities in processing of the analog input signal by the slope ADC 100 such that the transfer function of the slope ADC 100 becomes closer to a straight line compared to if a linear relationship between the slope signal and the counter signal would be used.

The nonlinear relationship between the slope signal and the counter signal may be configured for providing a linear transfer function of the slope ADC. However, it should be realized that nonlinearities of the slope ADC 100 may not be perfectly compensated for, such that the nonlinear relationship between the slope signal and the counter signal may be configured to improve linearity of the transfer function of the slope ADC 100.

The slope signal may be configured to be monotonically increasing or monotonically decreasing between a minimum value and a maximum value of the slope signal. Thus, the slope signal may be monotonically increasing from a minimum value to a maximum value. Alternatively, the slope signal may be monotonically decreasing from a maximum value to a minimum value.

The slope signal may be nonlinear in relation to time, such that an increase rate or decrease rate of the slope signal is not constant during the monotonical increasing or monotonical decreasing, respectively. The slope signal may be configured to increase/decrease in steps and having a constant value therebetween, which inherently means that the slope signal will be nonlinear in relation to time.

However, the slope signal may further be configured to have a varying period between time steps or a varying height of the voltage steps, adding further nonlinearity of the slope signal.

The counter signal may be configured to provide a sequence of digital values, the digital values in the sequence being monotonically increasing or monotonically decreasing. The counter signal may be configured to increase or decrease at least a least significant bit of the digital value between subsequent values in the sequence, i.e., increasing or decreasing the digital value by 1.

The counter signal may be nonlinear in relation to time. This implies that a timing of a change of the counter signal may vary with time or that a change in the digital value of the counter signal between subsequent values in the sequence may vary with time.

The counter signal may be generated based on a clock frequency, such that the digital value of the counter signal may increase or decrease with each period of a clock signal. The counter signal may be nonlinear in relation to time by the clock frequency controlling the counter signal being varied. According to an alternative, the counter signal may be nonlinear in relation to time by the changing of the digital value of the counter signal being based on different number of periods of the clock signal, such as the counter signal being changed after 1 period, 2 periods, etc. of the clock signal.

Since the slope signal and the counter signal have a nonlinear relationship, the slope signal and the counter signal will not vary with time in the same manner. As mentioned above, the slope signal may be nonlinear in relation to time. Also, the counter signal may be nonlinear in relation to time. It should be realized that at least one of the slope signal or the counter signal is nonlinear in relation to time in order for the slope signal and the counter signal to have a nonlinear relationship. Thus, the slope signal may be nonlinear in relation to time, while the counter signal is linear in relation to time. Alternatively, the counter signal may be nonlinear in relation to time, while the slope signal is linear in relation to time. According to yet another alternative, the slope signal and the counter signal are both nonlinear in relation to time, but not in the same manner, such that the slope signal and the counter signal have a nonlinear relationship.

Many different causes of nonlinear processing of the analog input signal in the slope ADC 100 may be conceived. In a relatively simple slope ADC 100 as illustrated in FIG. 1, sampling of the analog input signal onto the sampling capacitor 104 may be a cause of a nonlinear effect on the sampled value of the analog input signal. Thus, the nonlinear relationship of the slope signal and the counter signal may be adapted to compensate for a nonlinear relation between the analog input signal and the sampled value held by the sampling capacitor 104.

However, it should be realized that nonlinear effects on the sampled value of the analog input signal may have other causes. The nonlinear relationship of the slope signal and the counter signal may be used to compensate for any nonlinear effect, regardless of its cause.

Figure 2:
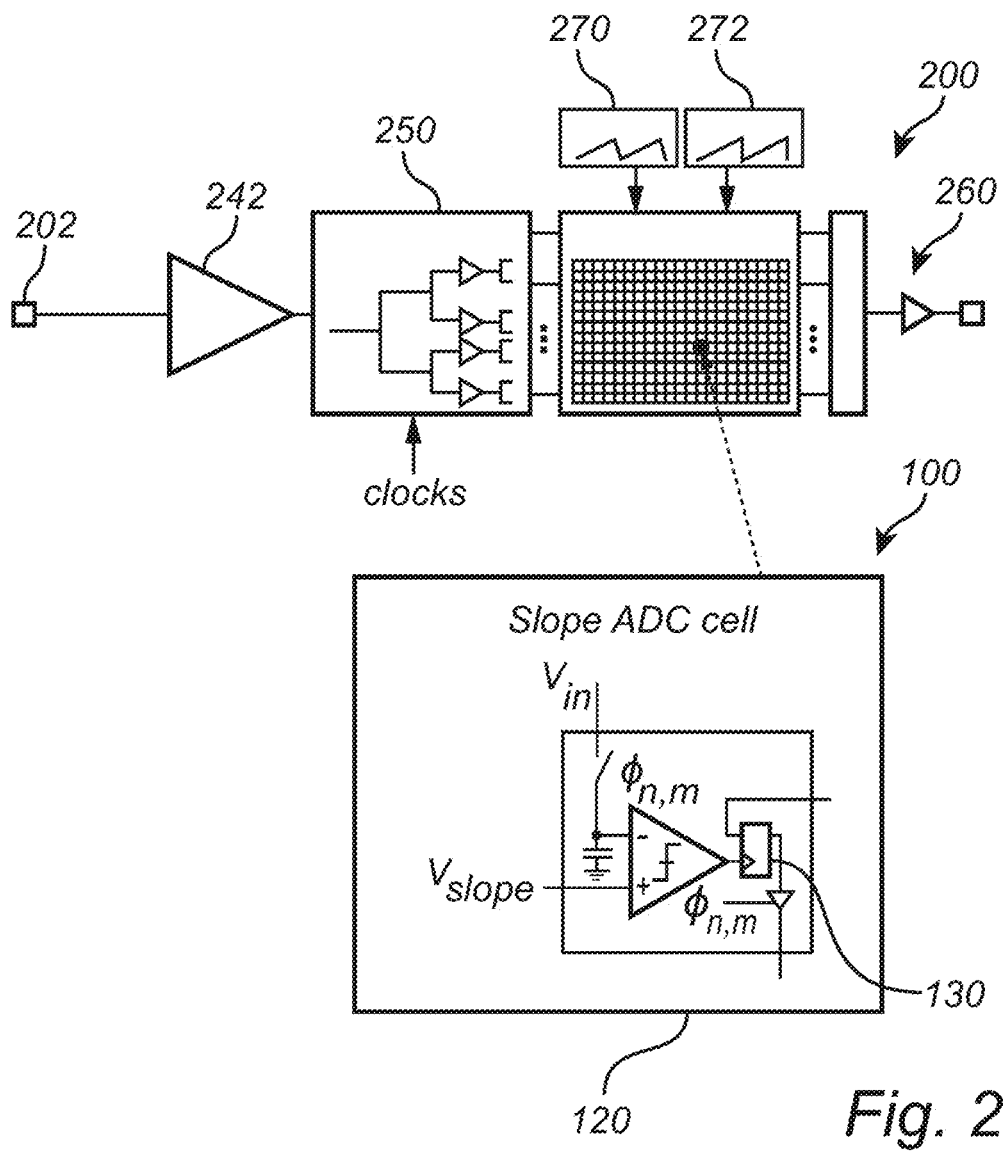
FIG. 2 is a schematic view of a system of slope ADCs according to an embodiment forming a time-interleaved ADC.

Referring now to FIG. 2, a system 200 for analog-to-digital conversion of analog input signals will be described. The system 200 comprises a plurality of slope ADCs, such as a plurality of slope ADCs 100 as described above. The system 200 in FIG. 2 illustrates a time-interleaved ADC 200.

The plurality of slope ADCs 100 may be arranged in parallel in order to achieve a plurality of parallel analog-to-digital conversion channels. The time-interleaved ADC 200 may comprise common input nodes 202 for receiving the analog input signal. For simplicity, only a single input node 202 is shown, but it should be realized that two input nodes may be used for receiving a differential analog input signal.

The time-interleaved ADC 200 may further comprise an input buffer 242, which is configured to receive the analog input signal from the input node 202. The input buffer 242 may be used for converting an impedance from a source of the analog input signal to a low value so that input impedance of the time-interleaved ADC 200 does not significantly affect the analog input signal.

The input buffer 242 may be implemented using a source follower circuit but it should be realized that other alternatives, such as using operational amplifiers, may be used.

The plurality of slope ADCs 100 may be connected to the common input node 202 via a time-interleaved sampling arrangement 250. The time-interleaved sampling arrangement 250 is configured to successively in time provide the analog input signal to each of the plurality of slope ADCs 100. The sampling arrangement 250 may thus provide a sampling network which provides sampling of a single analog input signal to the plurality of slope ADCs 100. Each of the slope ADCs 100 may thus obtain a sampled value of the analog input signal such that different slope ADCs 100 obtain sampled values representing the analog input signal at different points in time. This allows that plurality of ADCs 100 to be jointly used for increasing the sampling rate of the time-interleaved ADC 200.

The digital representation provided by each of the plurality of slope ADCs 100 may be output to a data aligner 260 which may combine the digital representation of the analog input signal from the plurality of slope ADCs 100 to form a combined sequence of digital values forming a complete digital representation of the analog input signal.

Figure 3:
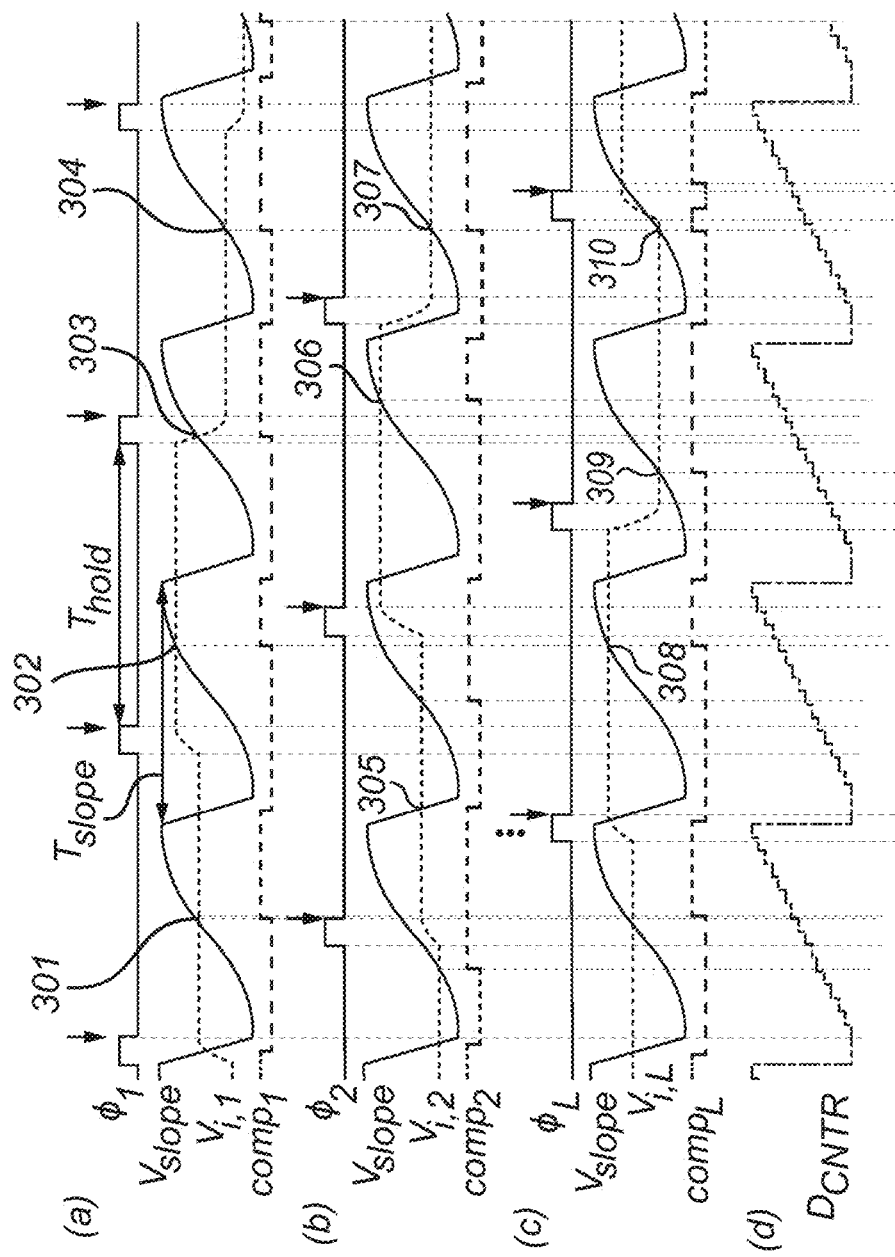
FIG. 3 is a schematic timing diagram of signals of the time-interleaved ADC.

Referring now to FIG. 3, time-interleaving of sampling of the analog input signal will be discussed in relation to an exemplary timing diagram of the time-interleaved ADC 200.

The timing diagram illustrates three time-interleaved channels, channels 1, 2, . . . , L, in the time-interleaved ADC 200. Each of the channels is represented by a 4-bit slope ADC 100, enabling conversion of a sampled value of the analog input signal to a 4-bit digital representation.

For each channel k, a signal ($\phi_k$ to the sampling switch 110, the common slope signal $V_{slope}$, the sampled value of the analog input signal $V_i$, and the output $comp_k$ from the comparator 120 is illustrated. The analog input signal $V_i$ is sampled at different moments in time in the different channels by the time-interleaved sampling arrangement 250, resulting in a sampled input signal $V_{i,k}$(k=1, 2, . . . , L) in the respective channels.

A common slope signal $V_{slope}$ may be shared for all the channels. Thus, a single slope signal may be generated, which implies that a common slope signal generator 270 may be used for all of the plurality of slope ADCs 100, providing a compact time-interleaved ADC 200.

The slope signal may be a monotonically increasing signal. As illustrated in FIG. 3, the slope signal may be nonlinear in relation to time. However, the same slope signal may be provided to each of the plurality of slope ADCs 100.

The slope signal may have a rise time $T_{rise}$ and a fall time $T_{fall}$ to reset the slope signal. The slope signal thus exhibits a slope repetition with a period $T_{slope}$ defined by: $T_{slope} = T_{rise} + T_{fall}$.

The time-interleaved ADC 200 may provide an overall sampling frequency $F_s$, which may be distributed on L interleaved channels such that each interleaved channel operate on a frequency L times lower than the overall sampling frequency $F_s$. Each channel is thus provided with a conversion time corresponding to $L*F_s$. The analog-to-digital conversion of each channel involves sampling of the analog input signal during a period $T_{track}$, at which the signal to the sampling switch $\phi_k$ is high and the analog input signal is tracked by the sampling capacitor 104, and hold time $T_{hold}$ during which the sampled value of the analog input signal is held by the sampling capacitor 104 and the sampled value is provided to the comparator 120 for converting the sampled value to a digital representation.

The slope repetition period $T_{slope}$ should be smaller than the hold time $T_{hold}$ for correct operation. When a common slope signal is used for all the slope ADCs 100, the timing of the period $T_{hold}$ may not align with a complete rising slope of the slope signal. However, thanks to the slope repetition period $T_{slope}$ being smaller than the hold time $T_{hold}$, the slope signal may during the hold time $T_{hold}$ assume all possible values between the minimum value and the maximum value at least once, although not necessarily in one consecutive monotonic rising slope. Rather, the slope signal may assume a first sub-range of the values in a first slope and may assume a second sub-range of the values in a second slope.

The counter signal $D_{CNTR}$ illustrated in section (d) of FIG. 3 may also be common to all of the plurality of ADCs 100. Thus, a single counter signal may be generated, which implies that a common counter signal generator 272 may be used for all of the plurality of slope ADCs 100, providing a compact time-interleaved ADC 200.

The memory element 130 of each channel may receive the common counter signal and may read in the value of the counter signal upon receiving a trigger signal. The trigger signal may be provided when the rising slope of the slope signal crosses the sampled value of the analog input signal. Since the slope repetition period $T_{slope}$ is smaller than the hold time $T_{hold}$, the slope signal will cross the sampled value of the analog input signal at least once.

The digital representation provided by each of the plurality of slope ADCs 100 may be output to the data aligner 260 which may re-sample the output from the plurality of slope ADCs such that the output from the data aligner 260 is synchronous with the overall sampling frequency $F_s$.

In section (a) of FIG. 3, the digital-to-analog conversion of channel 1 is illustrated. The first conversion 301 of channel 1 resembles a conversion of a conventional slope ADC, wherein the slope signal is monotonously increasing from the minimum value to the maximum value during the hold time $T_{hold}$. The signal comp, from the comparator 120 changes sign when the slope signal $V_{slope}$ crosses the sampled value of the analog input signal $V_{i,1}$ at the first conversion 301 and the corresponding value "9" of the counter signal is read into the memory element 130. In the second conversion 302, the slope signal does not start at the minimum value when the hold time begins. Nevertheless, the slope signal is smaller than the sampled value of the analog input signal when the hold time begins and the signal $comp_1$ from the comparator 120 changes sign when the slope signal $V_{slope}$ crosses the sampled value of the analog input signal $V_{i,1}$ at the second conversion 302 and the corresponding value "13" of the counter signal is read into the memory element 130. In the third conversion, the slope signal $V_{slope}$ crosses the sampled value of the analog input signal $V_{i,1}$ during the track period at a third conversion 303 providing an incorrect determination of the counter signal into the memory element. However, during the hold time, the signal $comp_1$ from the comparator 120 changes sign when the slope signal $V_{slope}$ again crosses the sampled value of the analog input signal $V_{i,1}$ at the fourth conversion 304 and the corresponding, correct value "4" of the counter signal is read into the memory element 130, overwriting the previously read, incorrect value.

In section (b) of FIG. 3, the digital-to-analog conversion of channel 2 is illustrated. In the first conversion 305 of channel 2, the slope signal is higher than the sample value when the hold time begins. The slope signal thus increases to its maximum value without the comparator 120 changing sign. Then, the slope signal is reset to its minimum value and the signal $comp_2$ from the comparator 120 changes sign when the slope signal $V_{slope}$ crosses the sampled value of the analog input signal $V_{i,2}$ at the first conversion 305 and the corresponding value "6" of the counter signal is read into the memory element 130. In the second conversion 306, the slope signal again is higher than the sample value when the hold time begins. After reset of the slope signal, the signal $comp_2$ from the comparator 120 changes sign when the slope signal $V_{slope}$ crosses the sampled value of the analog input signal $V_{i,2}$ at the second conversion 306 and the corresponding value "13" of the counter signal is read into the memory element 130. In the third conversion, the signal $comp_2$ from the comparator 120 changes sign when the slope signal $V_{slope}$ crosses the sampled value of the analog input signal $V_{1,2}$ at the third conversion 307 and the corresponding value "4" of the counter signal is read into the memory element 130.

In section (c) of FIG. 3, the digital-to-analog conversion of channel L is illustrated. In the first conversion 308 of channel L, the signal $comp_L$ from the comparator 120 changes sign when the slope signal $V_{slope}$ crosses the sampled value of the analog input signal $V_{i,L}$ at the first conversion 308 and the corresponding value "13" of the counter signal is read into the memory element 130. In the second conversion 309, 310, the signal $comp_L$ from the comparator 120 changes sign when the slope signal $V_{slope}$ crosses the sampled value of the analog input signal $V_{i,L}$ at the conversion 309 and the corresponding value "4" of the counter signal is read into the memory element 130. Then, after reset of the slope signal, the signal $comp_L$ from the comparator 120 again changes sign when the slope signal $V_{slope}$ crosses the sampled value of the analog input signal $V_{i,L}$ at the conversion 310 and the corresponding value "4" of the counter signal is again read into the memory element 130.

Referring again to FIG. 2, the time-interleaved sampling arrangement 250 may be configured to provide a hierarchical sampling arrangement, wherein sampling in at least two hierarchical levels is provided. The plurality of slope ADCs 100 may be arranged in a two-dimensional array in columns and rows and the hierarchical sampling arrangement may be configured to implement time-interleaving of the analog input signal over the rows of the array and over the columns of the array.

The hierarchical sampling arrangement 250 may split the analog input signal in N channels for N rows of the array. The input signal may thus be sampled by one of N interleaved sampling clocks at a frequency of $F_s/N$. The signals from this sampling may be distributed to the channels in each row and may each be further split into M channels. Each of the plurality of slope ADCs 100 may thus sample the analog input signal using interleaved sampling clocks at a frequency of $F_s/(N*M)$.

This two-dimensional arrangement of the slope ADCs 100 is a convenient way to time-interleave a large number of N×M slope ADC channels in a limited area.

The signals from the sampling through the hierarchical sampling arrangement may be distributed to the plurality of slope ADCs 100 through a buffered path. The sampling network may introduce nonlinear effects on the processing of the analog input signal, for instance, through the analog input signal being passed through a buffered path. Thus, the nonlinear relationship of the slope signal and the counter signal may be adapted to compensate for any nonlinearity on the analog input signal caused by the sampling network.

Although the system 200 is described above as providing a time-interleaved ADC, it should be realized that a system comprising a plurality of slope ADCs may alternatively be used for analog-to-digital conversion of a plurality of different analog input signals. Thus, the system may be configured to receive a plurality of analog input signals, and each slope ADC may be configured to receive a unique analog input signal among the plurality of analog input signals. The system may still be configured to use the same slope signal and the same counter signal by all of the plurality of slope ADCs, such that a compact and power-efficient system is provided.

The use of the nonlinear relation between the slope signal and the counter signal will now be discussed in more detail.

The slope signal and the counter signal have a nonlinear relationship, which may be used for compensating static nonlinearities. The static nonlinearities may occur in the input path for passing the analog input signal to an input terminal of the comparator 120.

The analog input signal $V_{in}$ may be mapped onto a signal at the input terminal of the comparator 120 via a function $f(V_{in})$ which has a linear part, $f_{linear}(V_{in})$ and a nonlinear part, $f_{nonlinear}(V_{in})$. Thus, the signal $V_s$ at the input terminal of the comparator may be defined as:

$$V_s = f(V_{in}) = f_{linear}(V_{in}) + f_{nonlinear}(V_{in}) = m \times V_{in} + V_0 + f_{nonlinear}(V_{in}),$$

where m, $V_0$ are scalars, wherein m defines a slope of the linear function and $V_0$ defines an offset, i.e., a value of the signal $V_s$ when the analog input signal is zero.

If the comparator 120 compares the signal $V_s$ directly to the slope signal, the comparator 120 toggles when the slope signal $V_{slope}$ gets equal to $V_s$. The corresponding value of the counter signal at that moment provides a result of the comparison, as a digital representation of the sampled value of the analog input signal.

If the slope signal $V_{slope}$ varies linearly with time t of conversion (toggling of the comparator 120), the slope signal $V_{slope}$ may be defined as:

$$V_{slope}(t) = \frac{V_{step}}{t_{step}} t + V_{start},$$

where $t_{step}$ is a time between subsequent changes of a value of the counter signal, $V_{step}$ is a size of a change of the slope signal during $t_{step}$, and $V_{start}$ is a value of the slope signal corresponding to the counter signal being 0.

As mentioned above, in a time-interleaved ADC 200, the slope signal is not necessarily 0 at beginning of conversion of the sampled value of the analog input signal. However, when the slope signal is reset, t starts again at 0 and the definition of $V_{slope}$ above remains valid.

Further, if the counter signal counter also varies linearly with time t, the counter signal may be defined as:

$$\text{counter} = \frac{t}{t_{step}}.$$

Based on the above, a relation may be defined for a value of the analog input signal $V_{in}=X$ and the digital number DN output by the slope ADC corresponding to a value read into the memory element 130 when the slope signal $V_{slope}$ equals the sampled value $V_s$ of the analog input signal:

$$m \times X + V_0 + f_{nonlinear}(X) = DN \times V_{step} + V_{start},$$

which may be rewritten as:

$$DN = \frac{m}{V_{step}} X + \frac{V_0 - V_{start}}{V_{step}} + \frac{f_{nonlinear}(X)}{V_{step}}.$$

According to the present inventive concept, the slope signal and the counter signal have a nonlinear relationship configured to compensate for the nonlinear part $f_{nonlinear}(X)$ so as to improve linearity of a transfer function between the analog input signal and the output digital representation.

According to an embodiment, the slope signal $V_{slope}$ may be provided with a nonlinear part $g_{nonlinear}$ such that the slope signal is nonlinear in relation to time. The nonlinear part $g_{nonlinear}$ may be expressed as a function of t l $t_{step}$, where $t_{step}$ is merely a constant value. Then, the slope signal may be defined as:

$$V_{slope} = \frac{V_{step}}{t_{step}} t + V_{start} + g_{nonlinear}\left(\frac{t}{t_{step}}\right),$$

which may be written as:

$$V_{slope} = \frac{V_{step}}{t_{step}} t + V_{start} + g_{nonlinear}(\text{counter}).$$

The digital number DN output for the analog input signal $V_{in}=X$ may now be expressed as:

$$DN = \frac{m}{V_{step}} X + \frac{V_0 - V_{start}}{V_{step}} + \frac{f_{nonlinear}(X) - g_{nonlinear}(DN)}{V_{step}}.$$

Thus, if the nonlinear part $g_{nonlinear}$ of the slope signal corresponds to the nonlinear part of the function f, the nonlinear terms cancel out and the slope ADC 100 provides a linear transfer function for converting the analog input signal to the digital representation.

Figure 4:
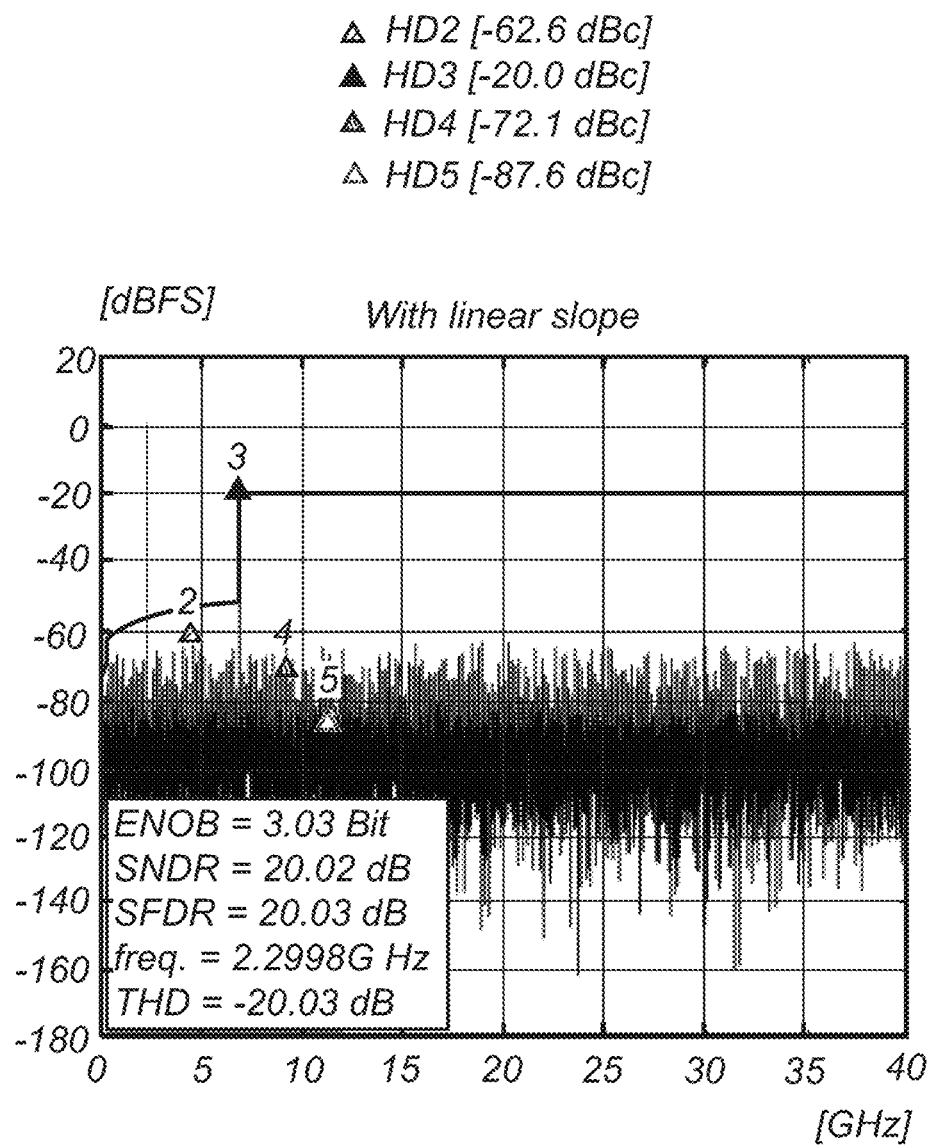
FIG. 4 is an output spectrum of a time-interleaved ADC with a simulated harmonic distortion.
Figure 5:
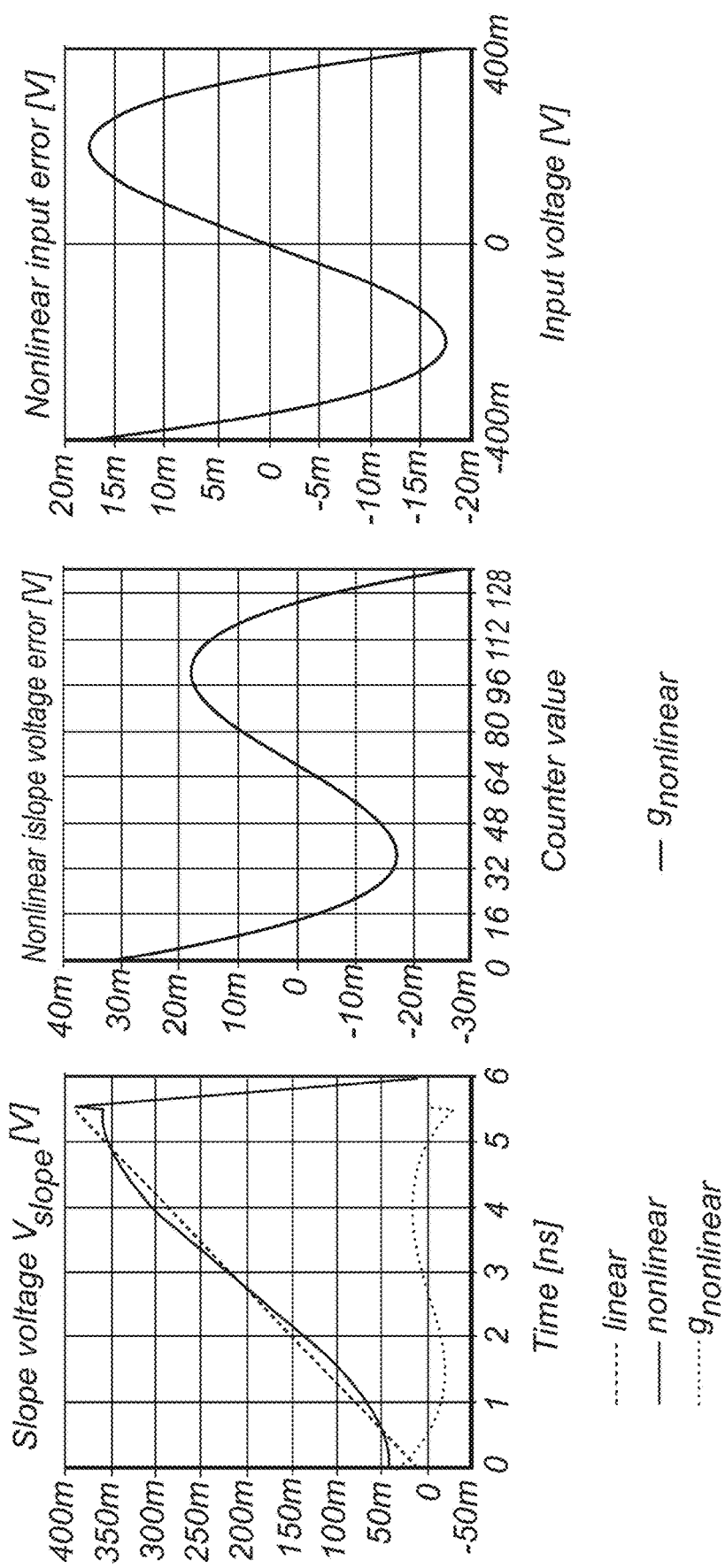
FIG. 5 is a schematic view of graphs for forming a nonlinear slope voltage for compensating for nonlinearities in a slope ADC.
Figure 6:
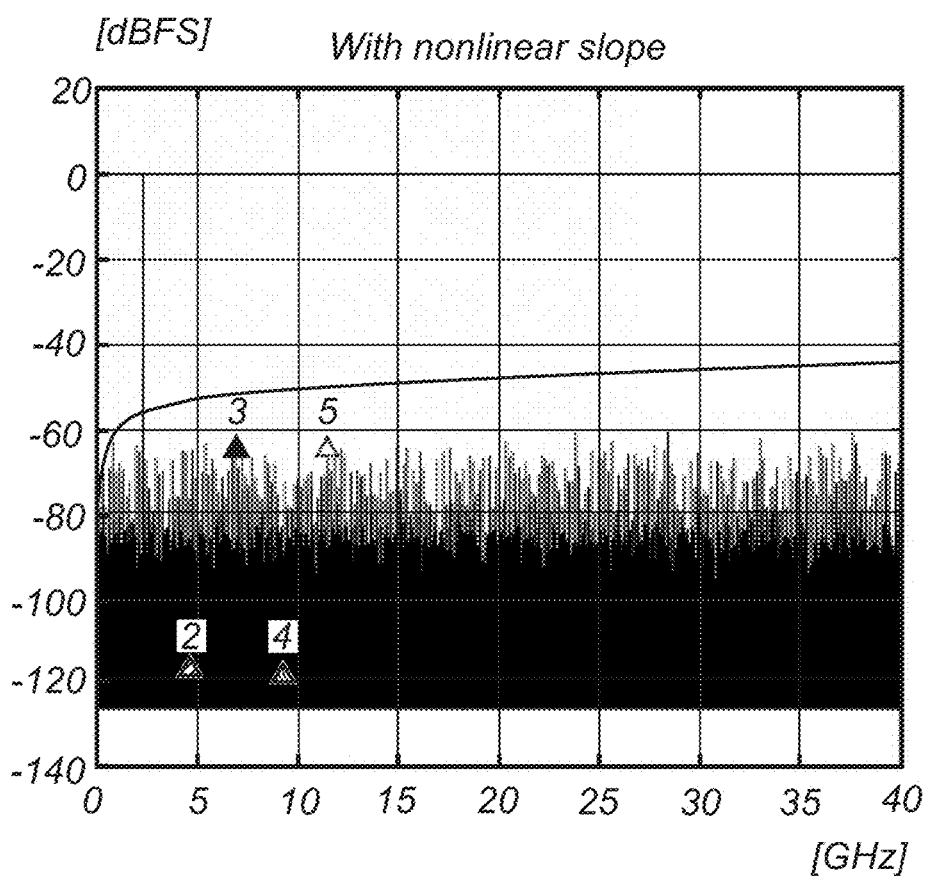
FIG. 6 is an output spectrum corresponding to FIG. 4 for a slope signal with nonlinearity compensation.

Referring now to FIGS. 4-6, use of a nonlinear relationship between the slope signal and the counter signal for improving linearity of the transfer function of the slope ADC 100 will be further discussed in relation to simulations.

If there are nonlinear effects on the analog input signal in the path to the input terminal of the comparator 120, such as through an input buffer having nonlinearities, an output spectrum of the slope ADC 100 will be affected. In particular, harmonic distortion tones may occur in the output spectrum.

In FIG. 4, an output spectrum of a slope ADC 100 using a linear relationship between the slope signal and the counter signal is illustrated. In order to simulate nonlinear effects, a third harmonic distortion of −20 dBc has been added, which is shown as a peak in the output spectrum.

Using a nonlinear relationship between the slope signal and the counter signal, the linearity of the transfer function of the slope ADC 100 may be improved.

In FIG. 5, a slope signal with a nonlinear relation to time for compensating the nonlinear effects illustrated in FIG. 4 is shown. In the rightmost graph of FIG. 5, the nonlinear part $f_{nonlinear}$ of the function for mapping the analog input signal $V_{in}$ onto the signal $V_s$ at the input terminal of the comparator 120 is shown as an input error compared to the input voltage $V_{in}$. In the center graph of FIG. 5, a corresponding nonlinear part $g_{nonlinear}$ of the function for defining the slope signal is shown as a function of the counter value. In the leftmost graph of FIG. 5, the slope signal is illustrated as a solid line, the linear part of the slope signal is illustrated as a dashed line, and the nonlinear part of the slope signal is illustrated as a dotted line. The slope signal is adapted to compensate for the nonlinear part $f_{nonlinear}$.

In FIG. 6, the output spectrum of the slope ADC 100 using the nonlinear relationship between the slope signal and the counter signal is illustrated. As illustrated in FIG. 6, second and third harmonic distortions are suppressed by cancellation of the nonlinear effects using a nonlinear relation between the slope signal and the counter signal.

When using a common slope signal and common counter signal for a plurality of slope ADCs 100 in a system 200, such as in a time-interleaved ADC, a common nonlinear relationship between the slope signal and the counter signal will be used for all channels (slope ADCs 100).

This implies that the nonlinear relationship between the slope signal and the counter signal may compensate for any nonlinear effects that are common to all of the channels. However, if there are differences in the nonlinear effects between different channels, the nonlinear relationship between the common slope signal and the common counter signal cannot perfectly compensate for the nonlinear effects of all channels. For instance, there may be mismatches in gain of different buffers for different channels, giving rise to different nonlinear effects for different channels.

The nonlinear effects may be seen as a nonlinear error between the output of the slope ADCs 100 and the analog input signal, when using a linear relationship between the slope signal and the counter signal. This nonlinear error may thus be different for different levels of the analog input signal and may further be different for different channels.

Figure 7:
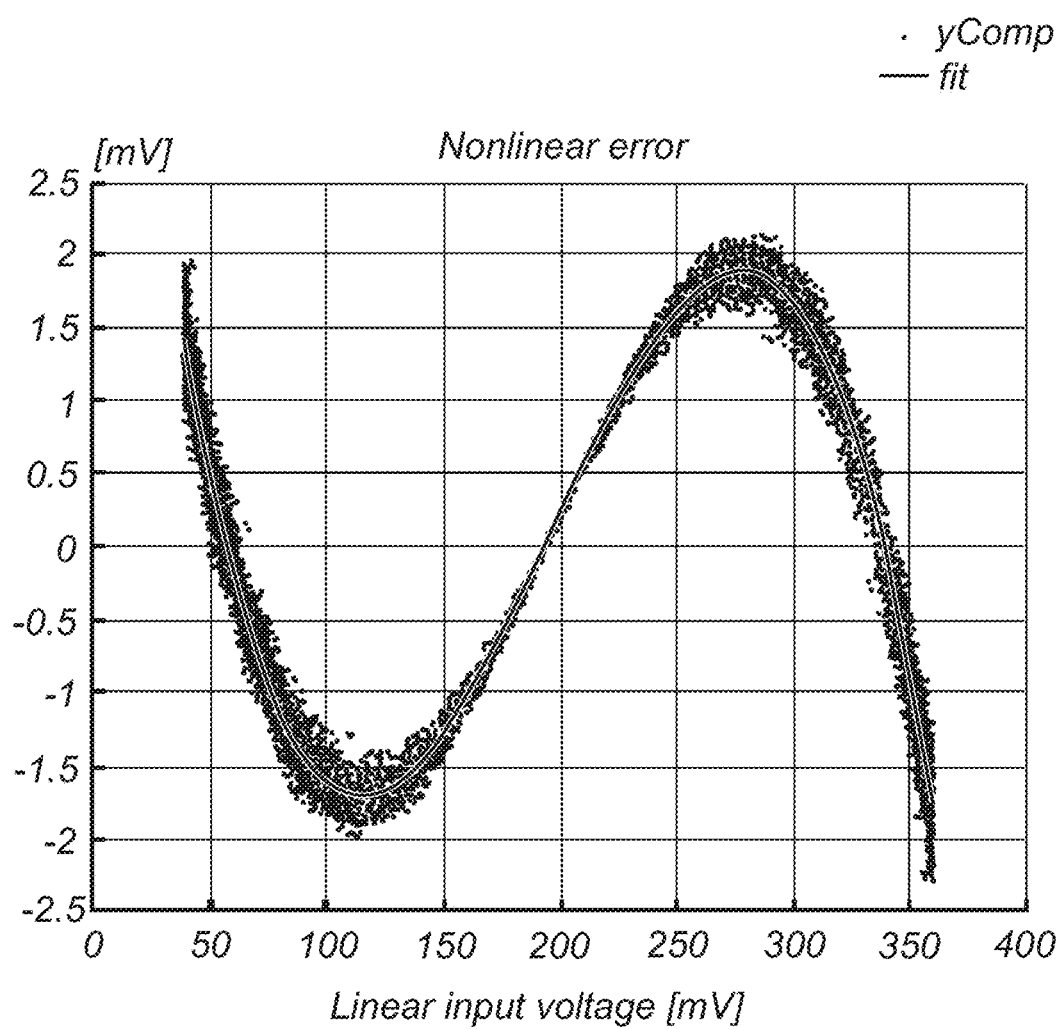
FIG. 7 is a graph illustrating fitting a nonlinearity compensation to nonlinear errors of a plurality of slope ADCs.

In FIG. 7, nonlinear errors are illustrated for a plurality of channels simulated to have different gain mismatches of input buffers. The nonlinear relationship between the slope signal and the counter signal may be defined by fitting a curve to an average nonlinear error, wherein the average nonlinear error is determined for different levels of the analog input signal. The nonlinear relationship may be determined by fitting a polynomial, such as a third order polynomial to the average nonlinear error values.

The slope signal may then be formed by adding the nonlinear compensation, as illustrated in FIG. 7, to a linear part of the function that defines the slope signal. The nonlinear relationship between the slope signal and the counter signal that is obtained in this manner may then improve an average error of the transfer functions of the plurality of slope ADCs.

The above discussion is based on the nonlinear relationship between the slope signal and the counter signal being formed by the slope signal being nonlinear in relation to time. However, it should be realized that, according to an alternative, the nonlinear relationship between the slope signal and the counter signal may be achieved by the counter signal being nonlinear in relation to time or by both the slope signal and the counter signal being nonlinear in relation to time.

Figure 8:
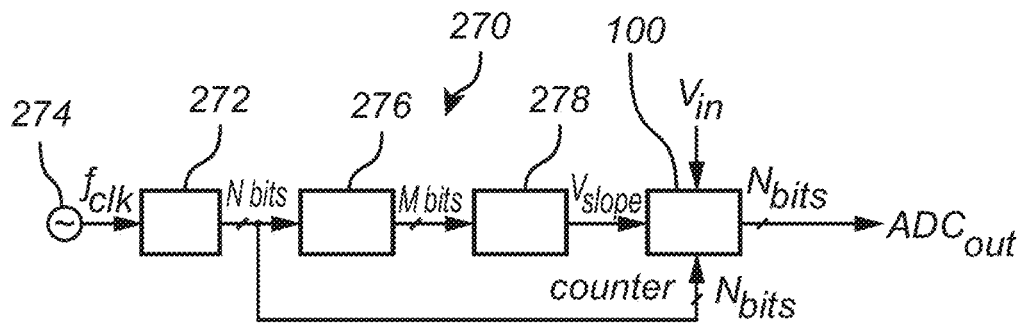
FIG. 8 is a schematic view of a slope signal generator and a counter signal generator.

Referring now to FIG. 8, a counter signal generator 272 and a slope signal generator 270 according to an embodiment will be described.

The counter signal generator 272 may be connected to a clock 274 for receiving a clock signal. The counter signal generator 272 may be configured to store a value and increment the stored value by 1 on each pulse from the clock. The counter signal generator outputs a N-bit value counter signal, the value of which is increased with every clock pulse.

The counter signal generator 272 may for instance be constructed of a number of flip-flops connected in cascade. The counter signal generator 272 may be synchronous such that all flip-flops are triggered by a common clock.

The slope signal generator 270 may be configured to generate the slope signal based on the counter signal output by the counter signal generator 272. The counter signal may be received by a mapping element 276, which is configured to map a value of the counter signal to a corresponding desired value of the slope signal according to a set nonlinear relationship between the slope signal and the counter signal.

The mapping element 276 may be configured to perform a digital processing of the counter signal in order to determine a digital representation of the desired value of the slope signal. The mapping element 276 may store a mapping of values of the counter signal to values of the slope signal, such that the mapping element may determine the desired value of the slope signal through look-up in a look-up table. The mapping element 276 may output the desired value of the slope signal represented by M bits, wherein M>N, such that an increased resolution of representing the slope signal is used compared to the resolution of the counter signal.

The signal from the mapping element 276 may be forwarded to a digital-to-analog converter (DAC) 278 for forming an analog slope signal. The DAC 278 is illustrated here as a voltage DAC 278, but it should be realized that a current DAC may be used instead. The current DAC outputs a current signal, which may then be converted to voltage slope signal for input to the slope ADC 100.

As illustrated in FIG. 8, the slope ADC 100 may thus receive the counter signal from the counter signal generator 272 and the slope signal from the slope signal generator 270 (e.g., from the DAC 278).

Figure 9:
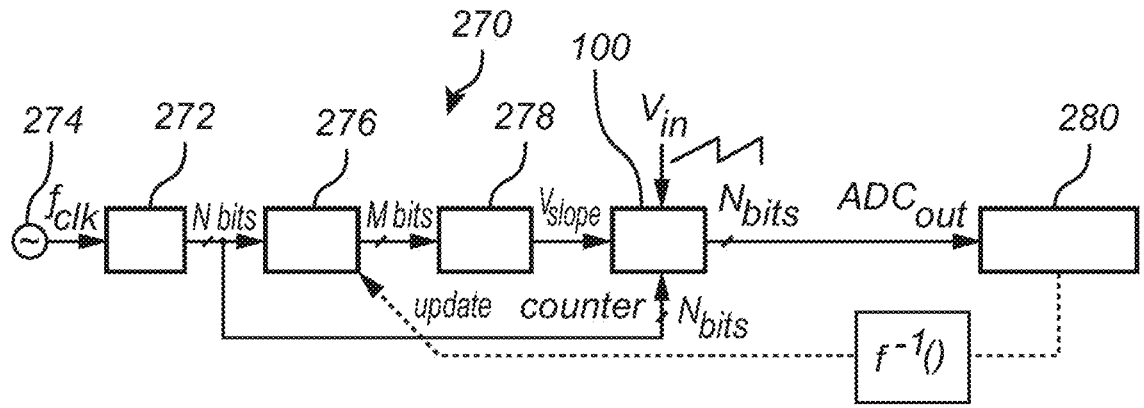
FIG. 9 is a schematic view of calibration of a slope ADC according to a first embodiment.
Figure 10:
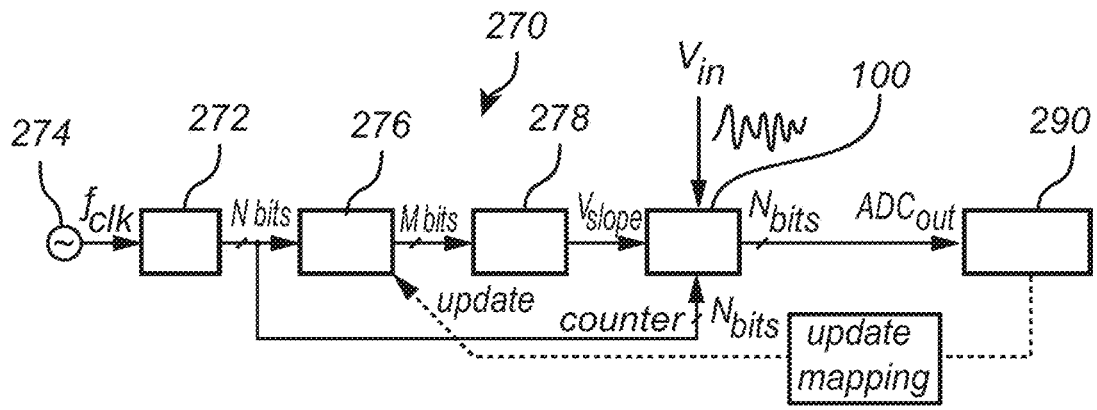
FIG. 10 is a schematic view of calibration of a slope ADC according to a second embodiment.

Referring now to FIGS. 9-10, calibration of the relation between the slope signal and the counter signal to be used for the slope ADC 100 will be discussed. The calibration may be based on a signal input to the slope ADC 100 and the corresponding signal output by the slope ADC 100, such that the nonlinear relationship between the slope signal and the counter signal may compensate for any nonlinearities in the slope ADC 100 regardless of the cause.

As illustrated in FIG. 9, the calibration may be based on applying a known analog input signal $V_{in}$, which is compared to the digital representation output by the slope ADC 100. The known analog input signal Vin may be controlled to assume values in an entire range of values accepted by the slope ADC 100. For instance, the known analog input signal may be a saw-tooth shaped signal providing a slope with monotonically increasing values of the analog input signal.

The slope ADC 100 may initially be provided with a counter signal and a slope signal having a linear (ideal) relationship.

The output from the slope ADC 100 may be analyzed for determining a difference between values of the analog input signal that correspond to each step of 1 least significant bit (LSB) in the digital representation. Thus, integral nonlinearities (INL) corresponding to variations in the difference between values of the analog input signal corresponding to 1 LSB may be determined in an INL extraction stage 280.

Based on determining the INL for each level of the analog input signal, a nonlinear error of the transfer function of the slope ADC 100 may be determined. A function f describing the nonlinear error may be inverted, $f^1()$ and the inverted function may be provided to the mapping element 276 so that the mapping is updated, and the nonlinear error is compensated for. Thus, the mapping element 276 may add a nonlinear part to the linear part of the slope signal.

The calibration may be run in several iterations for sequentially updating the mapping of the mapping element 276 until nonlinearities of the transfer function of the slope ADC 100 are sufficiently compensated for.

As illustrated in FIG. 10, the calibration may instead be based on applying a varying analog input signal $V_{in}$ with known statistics. Thus, the value of the analog input signal at every moment in time may not be known, but the statistics may be known (such as a histogram of values).

Instead of comparing individual values of the digital representation output by the slope ADC 100 to corresponding values of the analog input signal, statistics of the values of the digital representation may be monitored. The statistics of the digital representation may be compared to the known statistics of the analog input signal and a transfer function of the slope ADC 100 may be extracted based on the comparison.

The calibration may thus use a monitoring and transfer function extracting stage 290, which determines the transfer function of the slope ADC 100. This transfer function may be used for updating mapping of the mapping element 276.

Figure 11:
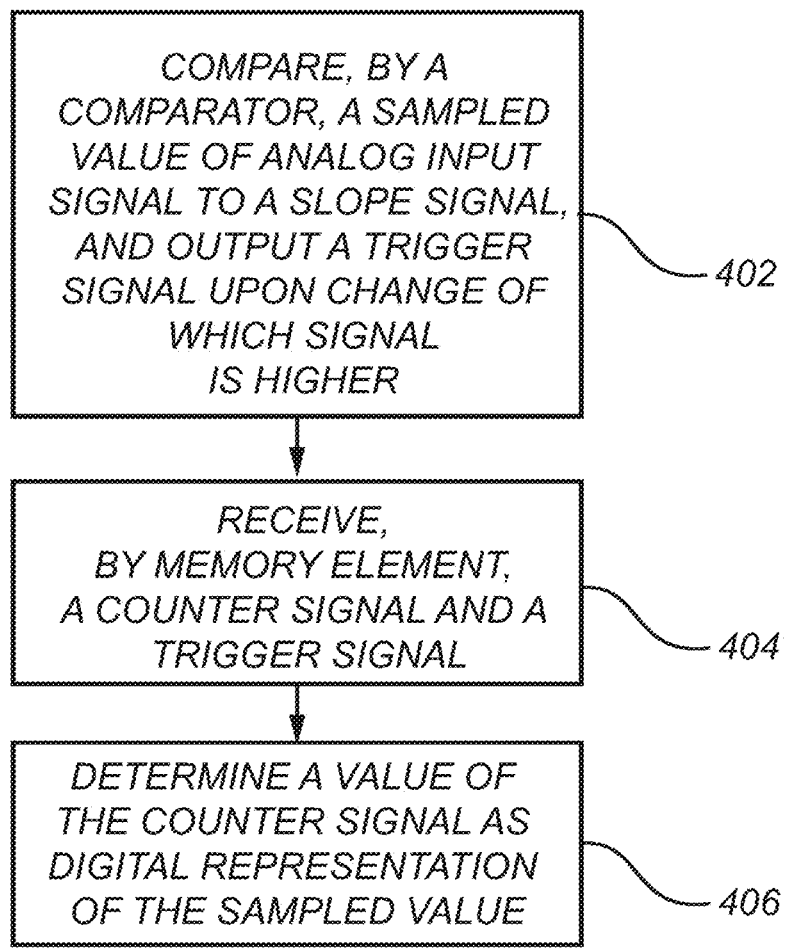
FIG. 11 is a flowchart of a method according to an embodiment.

Referring now to FIG. 11, a method for converting an analog input signal to a digital representation will be described.

The method comprises comparing 402 by a comparator two input signals involving a sampled value of the analog input signal and a slope signal. For instance, the comparator may directly compare the sampled value of the analog input signal and the slope signal. The comparing outputs a trigger signal upon identifying a change of which signal input to the comparator is higher.

The method further comprises receiving 404 by a memory element a counter signal and the trigger signal. Thus, the memory element may be triggered when the comparator identifies a change of which signal input to the comparator is higher.

The method further comprises determining 406 by the memory element a value of the counter signal when the trigger signal is received. The value of the counter signal may be read into the memory element when the trigger signal is received. The value of the counter signal may then be output as the digital representation of the sampled value of the analog input signal.

As described in detail above, the slope signal and the counter signal have a nonlinear relationship, wherein the nonlinear relationship is adapted to improve linearity of a transfer function for converting the analog input signal to the digital representation.

In the above the inventive concept has mainly been described with reference to a limited number of examples. However, as is readily appreciated by a person skilled in the art, other examples than the ones disclosed above are equally possible within the scope of the inventive concept, as defined by the appended claims.

The invention claimed is:

1. A slope analog-to-digital converter, ADC, for converting an analog voltage input signal to a digital representation, said slope ADC comprising:
   a comparator configured to compare two input signals, wherein a sampled value of the analog voltage input signal and a slope signal are used in forming the two input signals;
   a memory element, which is configured to receive a trigger signal based on the comparator identifying a change in which of the two input signals is higher, and a counter signal, wherein a value of the counter signal when the trigger signal is received provides the digital representation of the sampled value of the analog voltage input signal;
   wherein the slope signal and the counter signal have a nonlinear relationship, wherein the nonlinear relationship is adapted to compensate for a nonlinearity in processing of the analog voltage input signal.

2. The slope ADC according to claim 1, further comprising an input unit comprising a sampling capacitor, wherein the input unit is configured to receive the analog voltage input signal and hold the sampled value of the analog voltage input signal on the sampling capacitor, wherein the adaptation of the nonlinear relationship of the slope signal and the counter signal includes a compensation for a nonlinear relation between the analog voltage input signal and the sampled value held by the sampling capacitor.

3. The slope ADC according to claim 1, wherein the slope signal is configured to vary between a minimum value and a maximum value, wherein the slope signal is monotonically increasing or monotonically decreasing between the minimum value and the maximum value.

4. The slope ADC according to claim 3, wherein the slope signal is nonlinear in relation to time during monotonical increase or monotonical decrease.

5. The slope ADC according to claim 1, wherein the counter signal is nonlinear in relation to time.

6. The slope ADC according to claim 1, wherein said two input signals are the sampled value of the analog voltage input signal and the slope signal such that the comparator is configured to compare the sampled value of the analog voltage input signal and the slope signal.

7. The slope ADC according to claim 1, wherein the nonlinear relationship between the slope signal and the counter signal is based on a calibration of a nonlinear transfer function of the slope ADC for converting the analog voltage input signal to the digital representation.

8. The slope ADC according to claim 7, wherein the slope signal is based on a linear monotonically increasing or monotonically decreasing signal in combination with a nonlinear signal based on said calibration.

9. A system for analog-to-digital conversion of analog voltage input signals, wherein the system comprises a plurality of slope ADCs according to claim 1.

10. The system according to claim 9, wherein the system comprises a common slope signal generator and a common counter signal generator, such that the plurality of slope ADCs receive the same slope signal and the same counter signal.

11. The system according to claim 10, wherein the nonlinear relationship between the slope signal and the counter signal is adapted to improve an average error of transfer functions of the plurality of slope ADCs.

12. The system according to claim 9, wherein the system comprises a time-interleaved arrangement for providing a single analog voltage input signal to the plurality of slope ADCs, wherein the nonlinear relationship of the slope signal and the counter signal is configured to compensate for nonlinearity of the time-interleaved arrangement.

13. The system according to claim 9, wherein the system is configured to receive a single analog voltage input signal and the plurality of slope ADCs are configured to sample the single analog voltage input signal successively in time for forming a time-interleaved analog-to-digital converter.

14. A method for converting an analog voltage input signal to a digital representation, said method comprising:
   comparing by a comparator two input signals, wherein a sampled value of the analog voltage input signal and a slope signal are used in forming the two input signals, wherein a trigger signal is output by the comparator upon identifying a change in which of the two input signals is higher;
   receiving by a memory element a counter signal and the trigger signal, and
   determining by the memory element a value of the counter signal when the trigger signal is received as the digital representation of the sampled value of the analog voltage input signal, wherein the slope signal and the counter signal have a nonlinear relationship, wherein the nonlinear relationship is adapted to compensate for a nonlinearity in processing of the analog voltage input signal.

* * * * *